(12) United States Patent
Shim

(10) Patent No.: US 9,424,935 B2
(45) Date of Patent: Aug. 23, 2016

(54) SEMICONDUCTOR DEVICE

(71) Applicant: SK hynix Inc., Icheon-si, Gyeonggi-do (KR)

(72) Inventor: Keon Soo Shim, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/663,562

(22) Filed: Mar. 20, 2015

(65) Prior Publication Data

US 2016/0125944 A1 May 5, 2016

(30) Foreign Application Priority Data

Oct. 30, 2014 (KR) .......................... 10-2014-0149285

(51) Int. Cl.
| | |
|---|---|
| *G11C 11/34* | (2006.01) |
| *G11C 16/10* | (2006.01) |
| *G11C 16/26* | (2006.01) |
| *G11C 16/34* | (2006.01) |
| *G11C 16/04* | (2006.01) |

(52) U.S. Cl.
CPC ............ *G11C 16/10* (2013.01); *G11C 16/0483* (2013.01); *G11C 16/26* (2013.01); *G11C 16/3459* (2013.01)

(58) Field of Classification Search
CPC .... G11C 16/10; G11C 16/0483; G11C 16/26; G11C 16/3459
USPC ............ 365/185.01, 185.05, 185.06, 185.11, 365/185.17, 185.23, 189.011
See application file for complete search history.

(56) References Cited

U.S. PATENT DOCUMENTS

| 9,196,365 B2 * | 11/2015 | Park .................... G11C 16/10 |
| 9,240,420 B2 * | 1/2016 | Rabkin ............. H01L 27/1225 |
| 2015/0179266 A1 * | 6/2015 | Park .................... G11C 16/10 365/185.2 |

FOREIGN PATENT DOCUMENTS

| KR | 1020090070608 A | 7/2009 |
| KR | 1020130101811 A | 9/2013 |

* cited by examiner

*Primary Examiner* — Fernando Hidalgo
(74) *Attorney, Agent, or Firm* — William Park & Associates Ltd.

(57) ABSTRACT

A semiconductor device according to an embodiment may include a memory string including a drain selection transistor, memory cells and a source selection transistor all coupled between a bit line and a common source line, and the drain selection transistor, the memory cells and the source selection transistor configured to operate, respectively, in response to voltages applied to a drain selection line, word lines and a source selection line. The semiconductor device may include an operation circuit configured for performing a program operation. The operation circuit may be configured for sequentially performing a first operation, a second operation, and a third operation. In the first operation memory cells adjacent to the drain selection transistor may be programmed. In the second operation memory cells adjacent to the source selection transistor may be programmed. In the third operation remaining memory cells may be programmed.

16 Claims, 8 Drawing Sheets

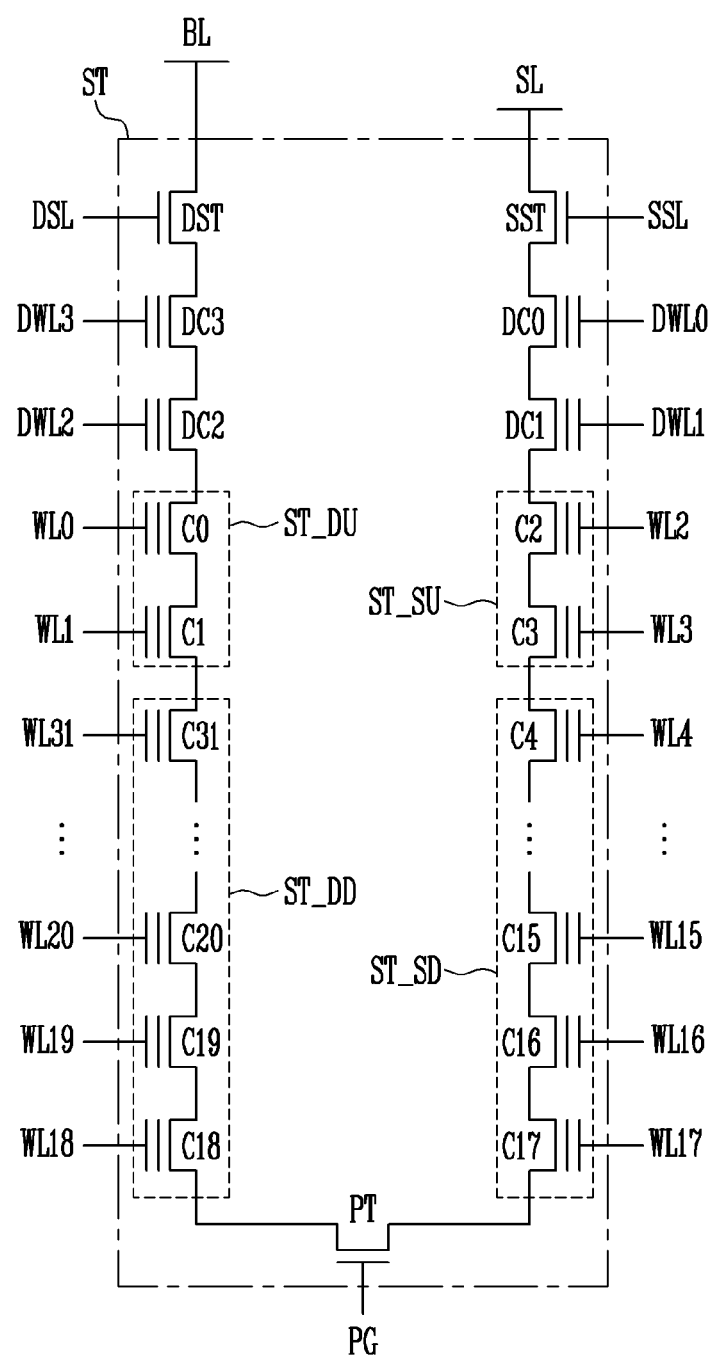

SEMICONDUCTOR DEVICE

CROSS-REFERENCE TO RELATED APPLICATION

The present application claims priority to Korean patent application number 10-2014-0149285 filed on Oct. 30, 2014, in the Korean Intellectual Property Office, the entire disclosure of which is incorporated by reference herein.

BACKGROUND

1. Technical Field

Various embodiments relate generally to a semiconductor device and, more particularly, to a semiconductor device including a memory cell.

2. Related Art

With regards to a flash memory device, memory cells may be electrically coupled in series between a bit line and a common source line. Data may be stored in the memory cells of the flash memory device by performing a program operation. During the program operation, a program voltage may be applied to a word line of the selected memory cells, and a pass voltage may be applied to the unselected word lines. However, the nearest memory cell to the bit line may have the worst electrical characteristics due to a program disturbance phenomenon since the nearest memory cell to the bit line is adjacent to a drain selection line and the last program operation is performed thereon.

BRIEF SUMMARY

A semiconductor device according to an embodiment may include a memory string including a drain selection transistor, memory cells and a source selection transistor all coupled between a bit line and a common source line, and the drain selection transistor, the memory cells and the source selection transistor configured to operate, respectively, in response to voltages applied to a drain selection line, word lines and a source selection line. The semiconductor device may include an operation circuit configured for performing a program operation. The operation circuit may be configured for sequentially performing a first operation, a second operation, and a third operation. In the first operation memory cells adjacent to the drain selection transistor may be programmed. In the second operation memory cells adjacent to the source selection transistor may be programmed. In the third operation remaining memory cells may be programmed.

A semiconductor device according to an embodiment may include a source selection transistor coupled to a common source line located over a substrate, a drain selection transistor coupled to a bit line located over the substrate, and a pipe transistor formed on the substrate. The semiconductor device may include a first cell string including memory cells coupled to the drain selection transistor, a second cell string including memory cells coupled to the source selection transistor, and a third cell string including memory cells coupled between the second cell string and the pipe transistor. The semiconductor device may include a fourth cell string including memory cells coupled between the first cell string and the pipe transistor. The semiconductor device may include an operation circuit configured for performing a program operation on the memory cells included in the first to fourth cell strings. The operation circuit may be configured for sequentially performing the program operations on the first to fourth cell strings.

BRIEF DESCRIPTION OF THE DRAWINGS

FIGS. 2A to 2C are views illustrating a representation of the structure of a memory block according to an embodiment.

DETAILED DESCRIPTION

Hereinafter, various examples of embodiments will be described in detail with reference to the accompanying drawings. The figures are provided to allow those with ordinary skill in the art to understand the scope of the embodiments. The various embodiments may, however, be embodied in different forms and should not be construed as limited to the embodiments set forth. Rather, these embodiments are provided so that this disclosure will be thorough and complete. In addition, the embodiments are provided to fully convey the scope of the application to those skilled in the art.

Various embodiments may generally relate to a semiconductor device capable of improving operating characteristics and electrical characteristics.

Figure 1:
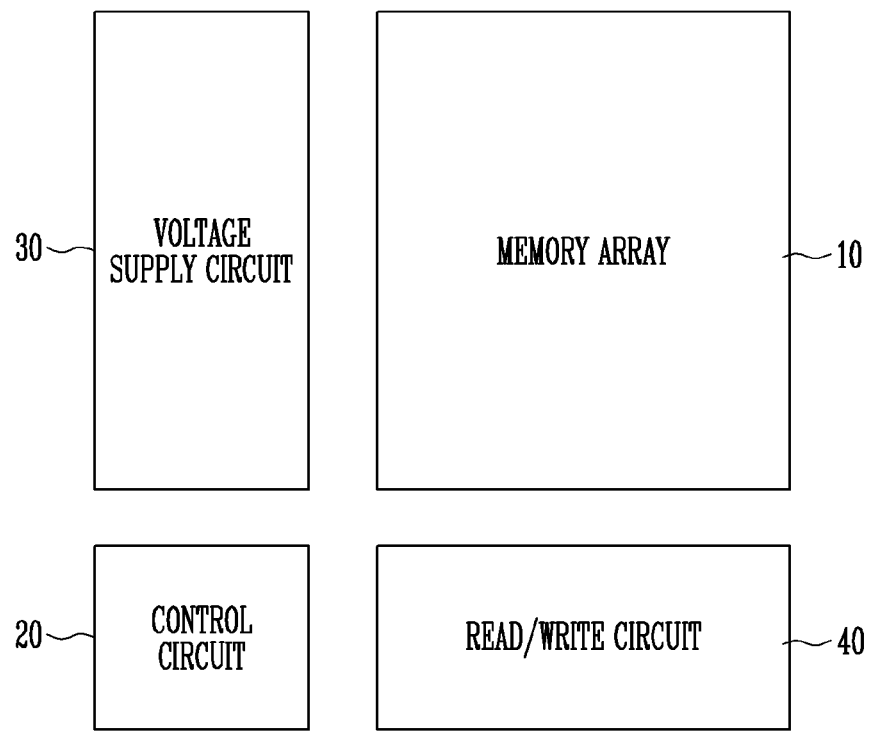
FIG. 1 is a block diagram illustrating a representation of a semiconductor device according to an embodiment.

FIG. 1 is a block diagram illustrating a representation of a semiconductor device according to an embodiment.

Referring to FIG. 1, a semiconductor device may include a memory array 10 and operation circuits (20 to 40). The memory array 10 may include a plurality of memory blocks (not illustrated). Each of the memory blocks may include a plurality of memory strings (not illustrated). Each of the memory strings may include a plurality of memory cells (not illustrated). In a flash memory device, a memory block may include flash memory cells. For example, a memory block may include flash memory cells each including a floating gate including polysilicon or a charge storage layer including a nitride layer.

The memory block may include memory strings coupled to bit lines (not illustrated), respectively, and coupled in parallel with a common source line (not illustrated). Each of the memory strings may include a two-dimensional structure or a three-dimensional structure over a semiconductor substrate. The memory block including the memory string including the three-dimensional structure is described below.

Figure 2A:
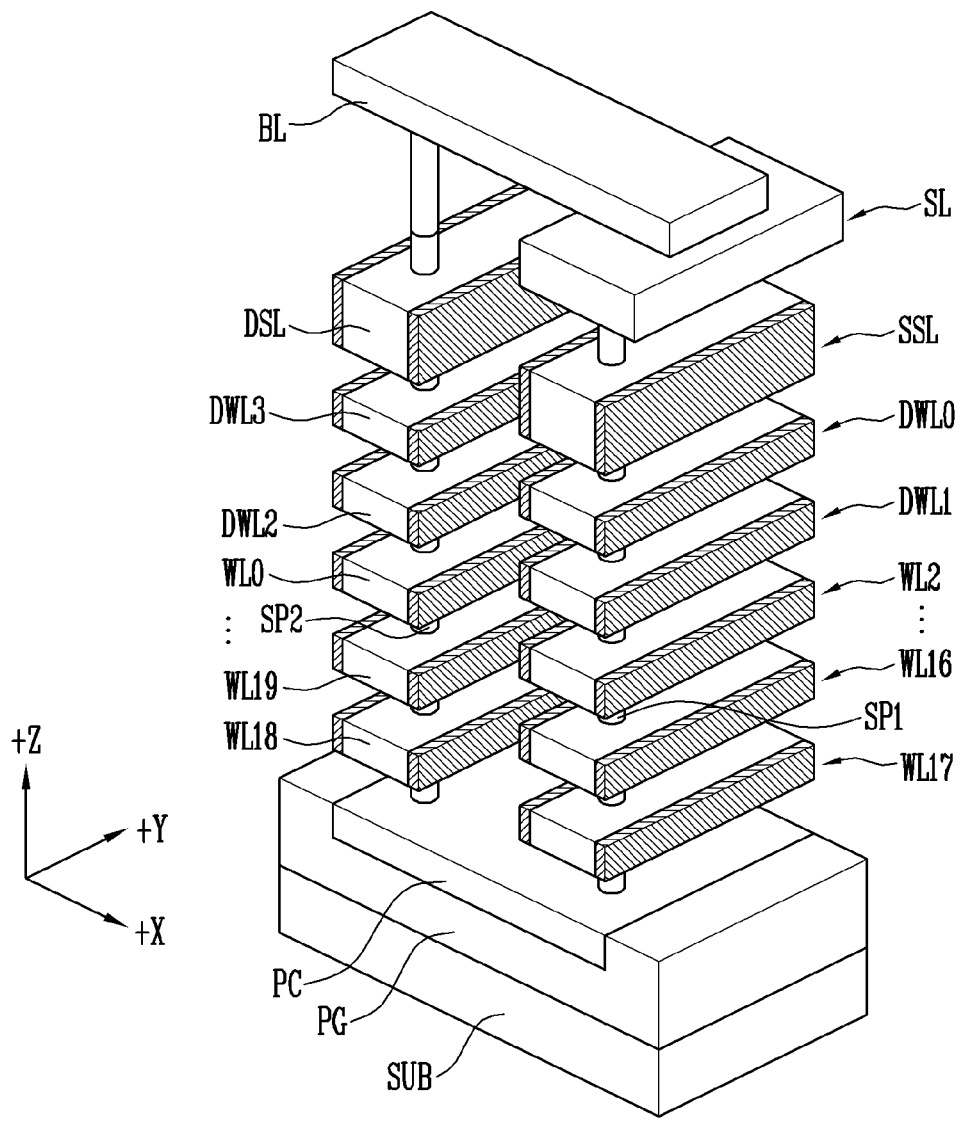
Figure 2C:
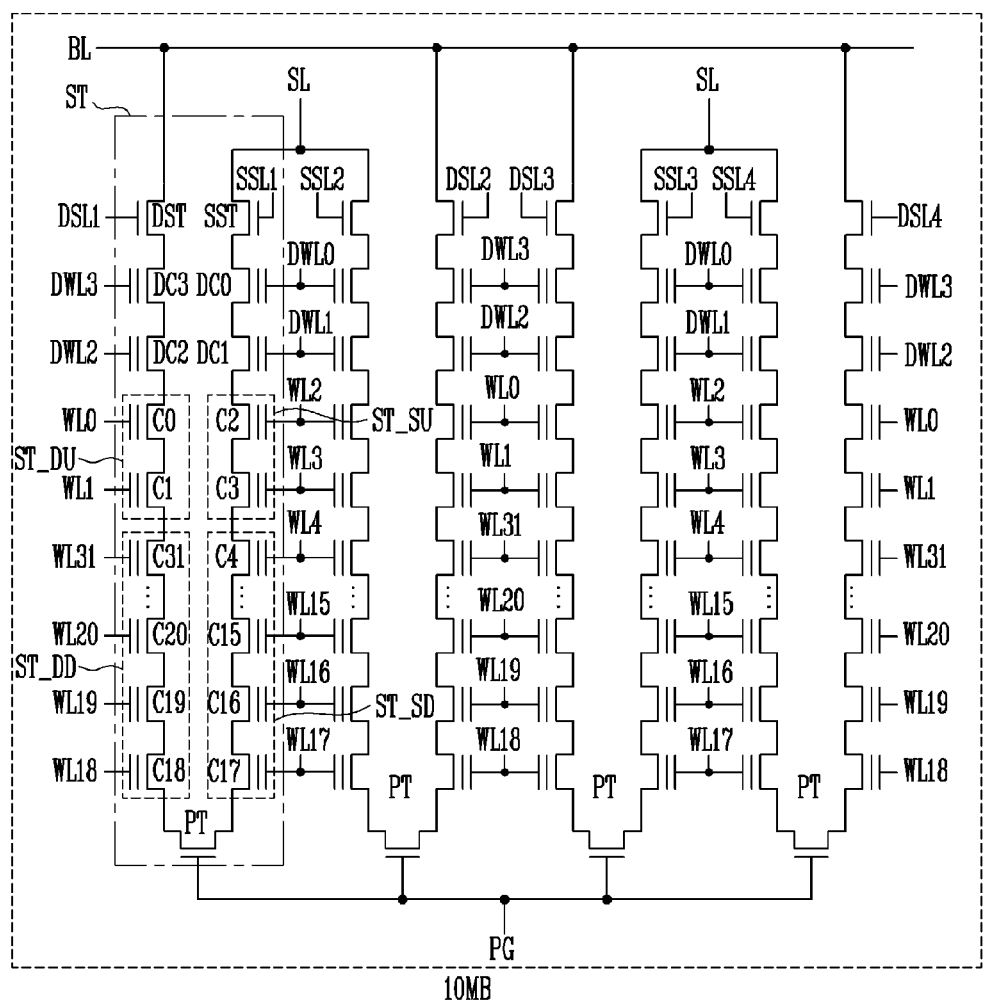

FIGS. 2A to 2C are views illustrating the structure of a representation of a memory block according to an embodiment.

Referring to FIGS. 2A and 2B, a pipe gate PG including a recessed portion may be formed on a semiconductor substrate SUB. A pipe channel layer PC may be formed in the recessed portion of the pipe gate PG. Vertical channel layers SP1 and SP2 may be formed over the pipe channel layer PC. A top portion of the first vertical channel layer SP1 may be coupled to a common source line SL between the common source line SL and the bottom portion of the first vertical channel layer SP1. A top portion of the second vertical channel layer SP2 may be coupled to the bit line BL. The vertical channel layers SP1 and SP2 may include polysilicon.

A plurality of conductive layers DSL, DWL3, DWL2, WL0, WL1, and WL31 to WL18 may be formed to surround the second vertical channel layer SP2 at different heights. A plurality of conductive layers SSL, DWL0, DWL1, and WL2 to WL17 may be formed to surround the first vertical channel layer SP1 at different heights. A multilayer film (not illustrated) including a charge storage layer may be formed on surfaces of the vertical channel layers SP1 and SP2 and a surface of the pipe channel layer PC. The multilayer film may further be formed between the vertical channel layers SP1 and SP2, the conductive layers DSL, DWL3, DWL2, WL0, WL1, WL31 to WL18, SSL, DWL0, DWL1, and WL2 to WL17 and between the pipe channel layer PC and the pipe gate PG.

An uppermost conductive layer surrounding the second vertical channel layer SP2 may be a drain selection line DSL. The lower conductive layers under the drain selection line DSL may be word lines DWL3, DWL2, WL0, WL1, and WL31 to WL18. The word lines under the drain selection line DSL may include dummy word lines DWL3 and DWL2. The word lines under the drain selection line DSL may include main word lines WL0, WL1, and WL31 to WL18. An uppermost conductive layer surrounding the first vertical channel layer SP1 may be a source selection line SSL. The lower conductive layers under the source selection line SSL may be word lines DWL0, DWL1, and WL2 to WL17. The word lines under the source selection line SSL may include dummy word lines DWL0 and DWL1. The word lines under the source selection line SSL may include main word lines WL2 to WL17.

First conductive layers SSL, DWL0, DWL1, and WL2 to WL17 and second conductive layers DSL, DWL3, DWL2, WL0, WL1, and WL31 to WL18 may be stacked in different areas of the semiconductor substrate. The first vertical channel layer SP1 passing through the first conductive layers SSL, DWL0, DWL1, and WL2 to WL17 may be coupled in a vertical direction between the source line SL and the pipe channel layer PC. The second vertical channel layer SP2 passing through the second conductive layers DSL, DWL3, DWL2, WL0, WL1, and WL31 to WL18 may be coupled in the vertical direction between the bit line BL and the pipe channel layer PC.

A drain selection transistor DST may be formed at a position where the drain selection line DSL surrounds the second vertical channel layer SP2. Dummy memory cells DC3 and DC2 and main memory cells C0, C1, and C31 to C18 may be formed at positions where the word lines DWL3, DWL2, WL0, WL1, and WL31 to WL18 surround the second vertical channel layer SP2, respectively. A source selection transistor SST may be formed at a position where the source selection line SSL surrounds the first vertical channel layer SP1. Dummy memory cells DC0 and DC1 and main memory cells C2 to C17 may be formed at positions where the dummy word lines DWL0 and DWL1 and the word lines WL2 to WL17 surround the first vertical channel layer SP1, respectively.

In the memory block including the above-described structure, a memory string ST may include the drain selection transistor DST, the dummy memory cells DC3 and DC2, and the main memory cells C0, C1, and C31 to C18. The drain selection transistor DST, the dummy memory cells DC3 and DC2, and the main memory cells C0, C1, and C31 to C18 of the memory string ST may be coupled in the vertical direction to the substrate SUB between the bit line BL and the pipe channel layer PC. The source selection transistor SST, the dummy memory cells DC0 and DC1, and the main memory cells C2 to C17 may be coupled in the vertical direction to the substrate between the common source line SL and the pipe channel layer PC.

The memory cells C0 and C1 coupled in series to the drain selection transistor DST may form a first cell string ST_DU. The memory cells C2 and C3 coupled in series with the source selection transistor SST may form a second cell string ST_SU. The memory cells C4 to C17 coupled between the second cell string ST_SU and a pipe transistor PT may form a third cell string ST_SD. The memory cells C31 to C18 coupled between the first cell string ST_SU and the pipe transistor PT may form a fourth cell string ST_SD.

The description is made in reference to an example including four dummy word lines DWL0 to DWL3 and thirty-two main word lines WL0 to WL31. However, the number of dummy word lines and the number of main word lines may vary and the embodiments are not limited as such.

Referring to FIG. 2C, a memory block 10MB may include a plurality of memory strings ST coupled to bit lines. In a P-BiCS (i.e., Pipe-shaped BiCS) structure, each of the memory strings ST may include the source selection transistor SST and the second and third cell strings ST_SU and ST_SD coupled in the vertical direction between the common source line SL and the pipe transistor PT of the substrate, and the drain selection transistor DST and the first and fourth cell strings ST_SU and ST_SD coupled in the vertical direction between the bit line BL and the pipe transistor PT of the substrate. The dummy memory cells DC0 and DC1 may be further coupled between the source selection transistor SST and the second cell string ST_SU. The dummy memory cells DC3 and DC2 may be further coupled between the drain selection transistor DST and the first cell string ST_DU.

The first cell string ST_DU may include the memory cells C0 and C1. The second cell string ST_SU may include the memory cells C2 and C3. The third cell string ST_SD may include the memory cells C4 to C17. The fourth cell string ST_DD may include the memory cells C31 to C18.

The source selection transistor SST may be controlled by a voltage applied to a source selection line SSL1, and the drain selection transistor DST may be controlled by a voltage applied to a drain selection line DSL1. The dummy memory cells DC0 to DC3 may be controlled by voltages applied to the stacked dummy word lines DWL0 to DWL3, respectively. The main memory cells C0 to C31 may be controlled by voltages applied to the stacked main word lines WL0 to WL31, respectively.

When the memory block 10MB is selected, the pipe transistor PT coupled between a pair of the memory cells C17 and C18 located in the middle of the memory string including the P-BiCS structure may electrically couple the vertical channel layers SP1 and SP2 illustrated in FIG. 2A included in the selected memory block 10MB.

In a memory block including a two-dimensional structure, each of the memory strings may be coupled to each of the bit lines, and drain selection transistors of the memory block may be simultaneously controlled by a single drain selection line. However, in the memory block 10MB having the 3D structure, the plurality of memory strings ST may be coupled in common to each of the bit lines BL. In the same memory block 10MB, the number of memory strings ST, which are coupled in common to a single bit line BL and controlled by the same word lines, may be changed depending on a design purpose.

Since the plurality of memory strings ST are coupled in parallel with the single bit line BL, the drain selection transistors DST may be independently controlled by selection voltages applied to the drain selection lines DSL1 to DSL4 in order to selectively couple the single bit line BL and the memory strings ST to each other.

The dummy memory cells DC0 to DC3 and the main memory cells C0 to C31 which are coupled in the vertical direction to the memory block 10MB may be controlled by operating voltages applied to the stacked dummy word lines DWL0 to DWL3 and the stacked main word lines WL0 to WL31, respectively. The word lines WL0 to WL31 may be divided into units of memory blocks.

Referring again to FIGS. 1 and 2B, the operation circuits 20 to 40 may be configured to perform a program loop, an erase loop and a read operation on the memory cells (i.e., C0) coupled to a selected word line, e.g., the word line WL0. The program loop may include a program operation and a verify operation, and the erase loop may include an erase operation and a verify operation. After the erase loop, the operation circuit 20 to 40 may perform a program operation (or post-program operation) to control an erase level at which threshold voltages of the memory cells are distributed.

In order to perform the program loop, the erase loop and the read operation, the operation circuit 20 to 40 may be configured to selectively output the operating voltages to local lines SSL, DLW0 to DWL3, WL0 to WL31, PG, and DSL and the common source line SL of the selected memory block, control precharge/discharge on the bit lines BL, or sense current flow (or voltage variations) on the bit lines BL.

In a NAND flash memory, the operation circuit may include a control circuit 20, a voltage supply circuit 30 and a read/write circuit 40. Each of these circuits is described below.

The control circuit 20 may control the voltage supply circuit 30 to generate operating voltages with desired levels to perform a program loop, an erase loop and a read operation in response to a command signal, and apply the operating voltages to the local lines SSL, DLW0 to DWL3, WL0 to WL31, PG, and DSL and the common source line SL of the selected memory block. The command signal may be input from an external device. In addition, the control circuit 20 may control the read/write circuit 40 to control precharge/discharge on the bit lines BL, or sense current flow (or voltage variations) on the bit lines BL during the read operation or a verify operation in response to data to be stored in the memory cells to perform the program loop, the erase loop and the read operation.

The voltage supply circuit 30 may generate the operating voltages necessary to perform the program loop, the erase loop and the read operation on the memory cells in response to control of the control circuit 20. The operating voltages may include a program voltage, a read voltage, an erase voltage, a pass voltage, a selection voltage, a common source voltage and the like. In addition, the voltage supply circuit 30 may output the operating voltages to the local lines SSL, DLW0 to DWL3, WL0 to WL31, PG, and DSL and the common source line SL of the selected memory block in response to a row address signal from the control circuit 20.

The read/write circuit 40 may include a plurality of page buffers (not illustrated) coupled to the memory array 10 through the bit lines BL. Each of the page buffers may be coupled to each of the bit lines BL. A single page buffer may be coupled to a single bit line. During the program operation, in response to a control signal from the control circuit 20 and the data to be stored in the memory cells, the page buffers may selectively precharge the bit lines BL. The control circuit 20 may control the page buffers to precharge the bit lines BL, sense voltage variations or current on the bit lines BL, and latch data the read from the memory cells during a program verify operation or a read operation.

Figure 3:
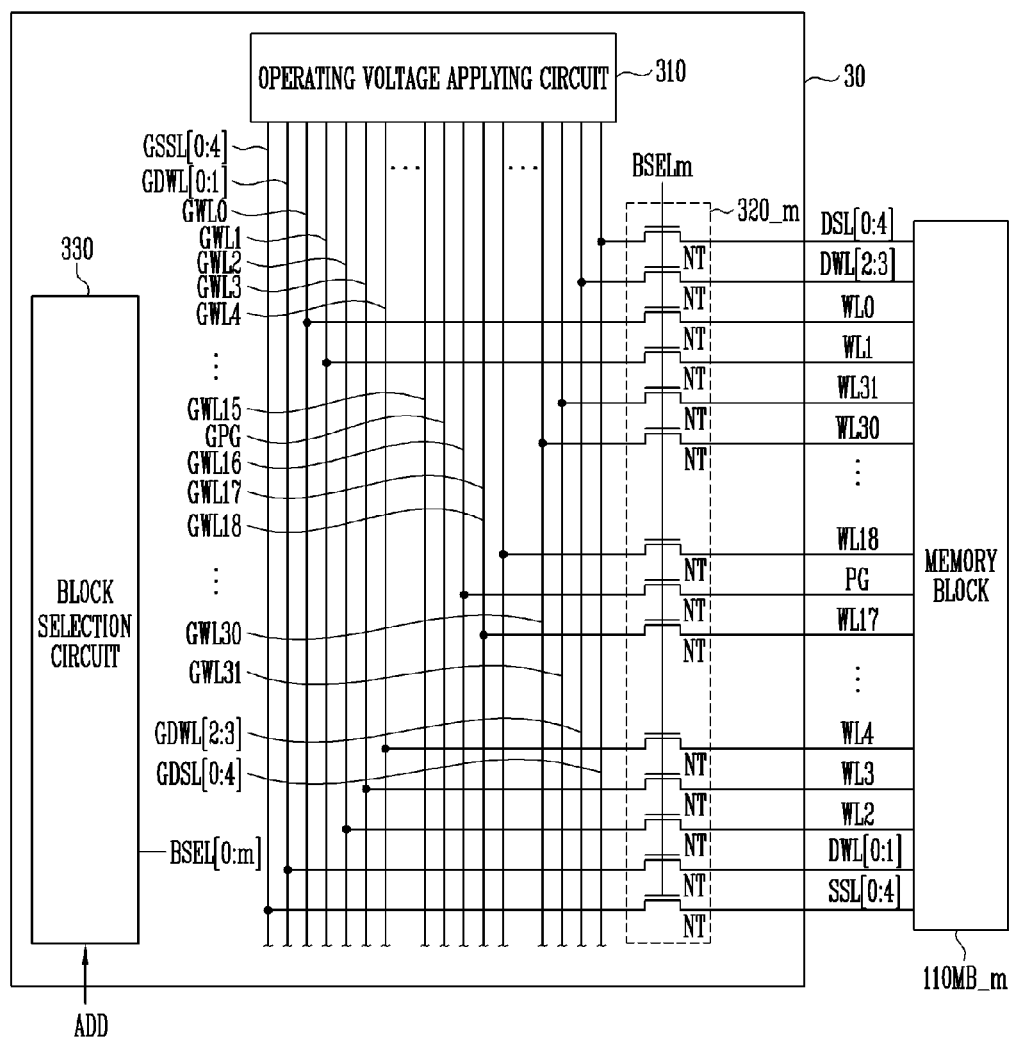
FIG. 3 is a circuit diagram of a representation of a voltage supply circuit according to an embodiment.

FIG. 3 is a block diagram illustrating a representation of a voltage supply circuit according to an embodiment.

Referring to FIG. 3, the voltage supply circuit 30 of the semiconductor device may include an operating voltage applying circuit 310, coupling circuits 320_m and a block selection circuit 330.

The operating voltage applying circuit 310 may be configured to output operating voltages to global lines GSSL[0:4], GDWL0 to GDWL3, GWL0 to GWL31, GPG, and GDSL[0:4]. For example, the operating voltage applying circuit 310 may output the operating voltages necessary to perform a program operation, a read operation, an erase operation and a verify operation on the memory cells to the global lines GSSL [0:4], GDWL0 to GDWL3, GWL0 to GWL31, GPG, and GDSL[0:4]. The operating voltage applying circuit 310 may apply a program voltage or the read voltage to the selected global word line to perform the program operation or the read operation on the memory cells, and the pass voltage to remaining global word lines. In addition, to perform an erase operation on the memory cells, the operating voltage applying circuit 310 may apply the erase voltage to the common source line SL, and control floating states of the global lines GSSL[0:4], GDWL0 to GDWL3, GWL0 to GWL31, GPG, and GDSL[0:4].

The coupling circuits 320_m may be coupled between the global lines GSSL[0:4], GDWL0 to GDWL3, GWL0 to GWL31, GPG, and GDSL[0:4] and the local lines SSL[0:4], DWL0 to DWL3, WL0 to WL31, PG, and DSL[0:4] of memory blocks 10MB_0 to 10MB_m, and operate in response to block selection signals BSEL[0:m] from the block selection circuit 330. The coupling circuits 320_m may selectively couple the global lines GSSL[0:4], GDWL0 to GDWL3, GWL0 to GWL31, GPG, and GDSL[0:4] to the local lines SSL[0:4], DWL0 to DWL3, WL0 to WL31, PG, and DSL[0:4] of the selected memory block 10MB_m, respectively, in response to the block selection signals BSEL [0:m] from the block selection circuit 330 so that the operating voltages, e.g., program voltage, erase voltage, read voltage, pass voltage, pipe gate voltage, and verify voltage, output to the global lines GSSL[0:4], GDWL0 to GDWL3, GWL0 to GWL31, GPG, and GDSL[0:4] from the operating voltage applying circuit 310 may be transferred to the local lines SSL[0:4], DWL0 to DWL3, WL0 to WL31, PG, and DSL[0: 4] of the selected memory block 10MB_m, respectively.

The coupling circuits 320_m may further include transistors NT coupled between the global lines GSSL[0:4], GDWL0 to GDWL3, GWL0 to GWL31, GPG, and GDSL[0: 4] and the local lines SSL[0:4], DWL0 to DWL3, WL0 to WL31, PG, and DSL[0:4] of the memory block. The operating voltages having a high level may be applied to drains of the transistors NT, and one of the block selection signals BSEL[0:m] of the block selection circuit 330, i.e., the block selection signal BSELm may be applied to gates thereof.

In the flash memory device, each of the memory blocks 10MB_m may include the coupling circuits 320_m. The coupling circuits 320_m may be selectively operated in response to the block selection signals BSEL[0:m] of the block selection circuit 330. For example, only the coupling circuits 320_m of the selected memory block 10MB_m may be selectively operated by the block selection signal BSELm of the block selection circuit 330.

The block selection circuit 330 may output the block selection signals BSEL[0:m] to the coupling circuits 320_m, respectively, in response to the address signal ADD. The block selection signals BSEL[0:m] may be activated or deactivated in response to the address signal ADD. When the activated block selection signal BSELm is input, the coupling circuits 320_m may couple the global lines GSSL[0:4], GDWL0 to GDWL3, GWL0 to GWL31, GPG, and GDSL[0:

4] to the local lines SSL[0:4], DWL0 to DWL3, WL0 to WL31, PG, and DSL[0:4] of the selected memory block 10MB_m. When the deactivated block selection signal BSELm is input, the coupling circuits 320_m may block the global lines GSSL[0:4], GDWL0 to GDWL3, GWL0 to GWL31, GPG, and GDSL[0:4] from being coupled to the local lines SSL[0:4], DWL0 to DWL3, WL0 to WL31, PG, and DSL[0:4] of an unselected memory block 10MB_m.

In order to transfer the operating voltages of the global lines GSSL[0:4], GDWL0 to GDWL3, GWL0 to GWL31, GPG, and GDSL[0:4] to the local lines SSL[0:4], DWL0 to DWL3, WL0 to WL31, PG, and DSL[0:4] of the selected memory block 10MB_m without voltage drop, the block selection circuit 330 may be to output the block selection signal BSELm having a greater level than the operating voltage to the coupling circuits 320_m. For example, the block selection circuit 330 may output the block selection signal BSELm having a greater level than the program voltage by at least a threshold voltage of the transistor NT for a period in which the operating voltage applying circuit 310 outputs the operating voltages including the program voltage to the global lines GSSL[0:4], GDWL0 to GDWL3, GWL0 to GWL31, GPG, and GDSL[0:4].

The connection relationships between the global lines GSSL[0:4], GDWL0 to GDWL3, GWL0 to GWL31, GPG, and GDSL[0:4] and the local lines SSL[0:4], DWL0 to DWL3, WL0 to WL31, PG, and DSL[0:4] are described below. A word line adjacent to the drain selection line DSL which is originally the last word line may be coupled to the first global word line GWL0 and become the first word line WL0. In addition, a word line adjacent to the source selection line SSL which is originally the first word line may be coupled to the third global word line GWL2 and become the third word line WL2.

As described above, by changing the method by which the global lines GSSL[0:4], GDWL0 to GDWL3, GWL0 to GWL31, GPG, and GDSL[0:4] are coupled to the local lines SSL[0:4], DWL0 to DWL3, WL0 to WL31, PG, and DSL[0:4], the program order of the memory cells C0 to C31 may be changed. The program order of the memory cells C0 to C31 may be described below with reference to FIG. 4.

Figure 4:
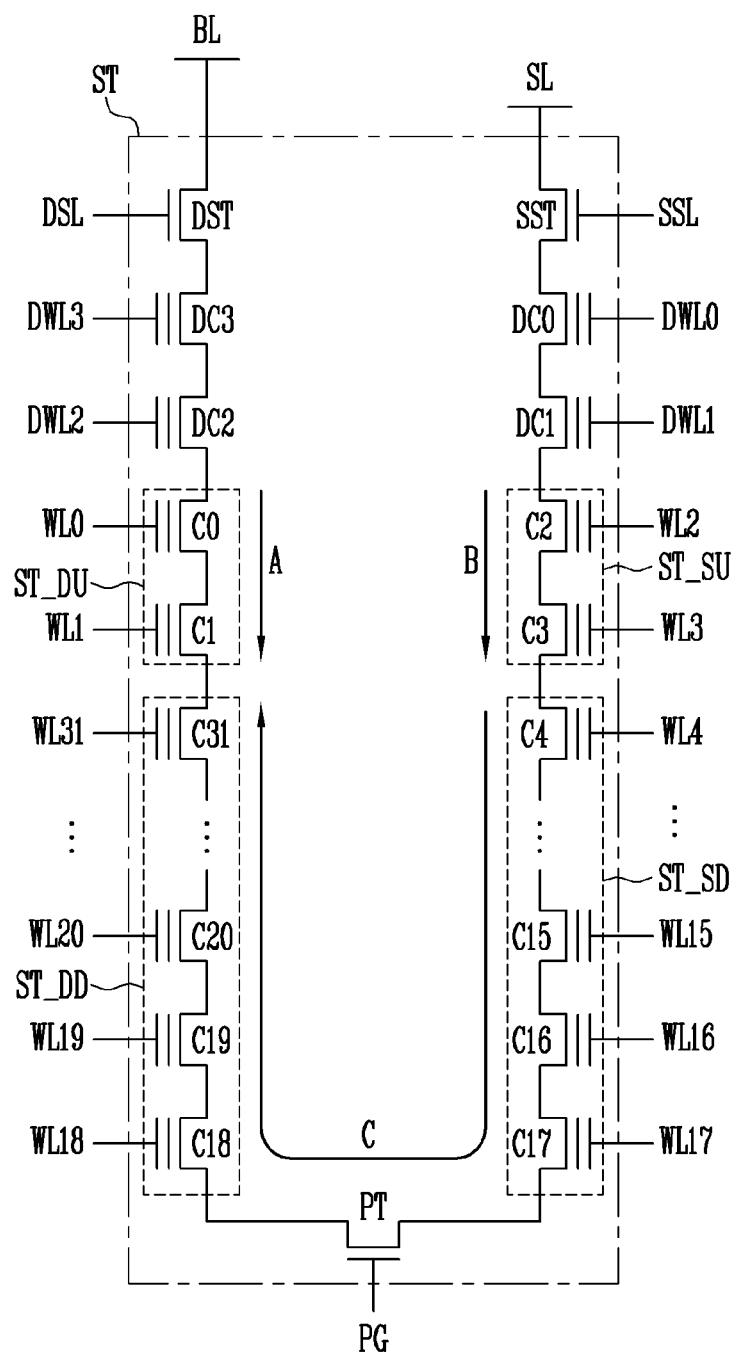
FIG. 4 is a circuit diagram illustrating a representation of a method of operating a semiconductor device according to an embodiment.

Hereinafter, operations of the semiconductor device including the above configurations are described below. FIG. 4 is a circuit diagram illustrating a representation of a method of operating a semiconductor device according to an embodiment.

Referring to FIGS. 3 and 4, the operation circuit 30 may perform a program operation on the memory cells C0 to C31 coupled between the bit line BL and the common source line SL. The memory cells C0 to C31 may be divided into the memory cells C0 and C1 adjacent to the drain selection transistor DST, the memory cells C2 and C3 adjacent to the source selection transistor SST, and the remaining memory cells C4 to C31. The memory cells C0 to C31 may be divided into the memory cells C0 and C1 coupled to the drain selection transistor DST and forming the first cell string ST_DU, the memory cells C2 and C3 coupled to the source selection transistor SST and forming the second cell string ST_SU, the memory cells C4 to C17 coupled between the second cell string ST_SU and the pipe transistor PT and forming the third cell string ST_SD, and the memory cells C31 to C18 coupled between the first cell string ST_DU and the pipe transistor PT and forming the fourth cell string ST_DD.

When performing the program operation, the operation circuit 30 may sequentially perform a first operation in which the memory cells C0 and C1 adjacent to the drain selection transistor DST are sequentially programmed, a second operation in which the memory cells C2 and C3 adjacent to the source selection transistor SST are sequentially programmed, and a third operation in which the memory cells C4 to C31 are programmed. In other words, the operation circuit 30 may sequentially perform program operations on the first to fourth cell strings ST_DU, ST_SU, ST_SD, and ST_DD.

During the first operation in which the memory cells C0 and C1 of the first cell string ST_DU are programmed, the operation circuit 30 may program the memory cells C0 and C1 in ascending order (A) of distance from the drain selection transistor DST. During the second operation in which the memory cells C2 and C3 of the second cell string ST_SU are programmed, the operation circuit 30 may program the memory cells C2 and C3 in ascending order (B) of distance from the source selection transistor SST. In the third operation in which the memory cells C4 to C31 are programmed, the operation circuit 30 may perform the memory cells C4 to C31 in ascending order of distance from the source selection transistor SST in descending order (C) of distance from the drain selection transistor DST. In other words, during the third operation, the operation circuit 30 may program the memory cells C4 to C17 of the third cell string ST_SD in ascending order (C) of distance from the source selection transistor SST and perform the memory cells C31 to C18 of the fourth cell string ST_SD in descending order (C) of distance from the drain selection transistor DST.

The first dummy memory cells DC0 and DC1 may be further coupled between the source selection transistor SST and the memory cell C2. The first dummy memory cells DC0 and DC1 may be operated in response to voltages applied to the first dummy word lines DWL0 and DWL1 between the source selection line SSL and the word line WL2. The second dummy memory cells DC2 and DC3 may be further coupled between the drain selection transistor DST and the memory cell C0. The second dummy memory cells DC2 and DC3 may be operated in response to voltages applied to the second dummy word lines DWL2 and DWL3 between the drain selection line DSL and the word line WL0.

The operation circuit 30 may perform a program operation (i.e., first operation) on the memory cells C0 to C31 after performing a program operation on the first and second dummy memory cells DC0 to DC3. The operation circuit 30 may simultaneously perform a program operation on the dummy memory cells DC0 to DC3.

After completing the program operation, the operation circuit 30 may perform a read operation and a verify operation on the memory cells C0 to C31 in the same order (A, B and C) as the program operation performed on the memory cells C0 to C31.

As described above, the operation circuit 30 may control the program order of the memory cells C0 to C31, so that electrical characteristics (e.g., program disturbance phenomenon) of the memory cell adjacent to the bit line BL may be improved and the entire operating characteristics may be improved.

Figure 5:
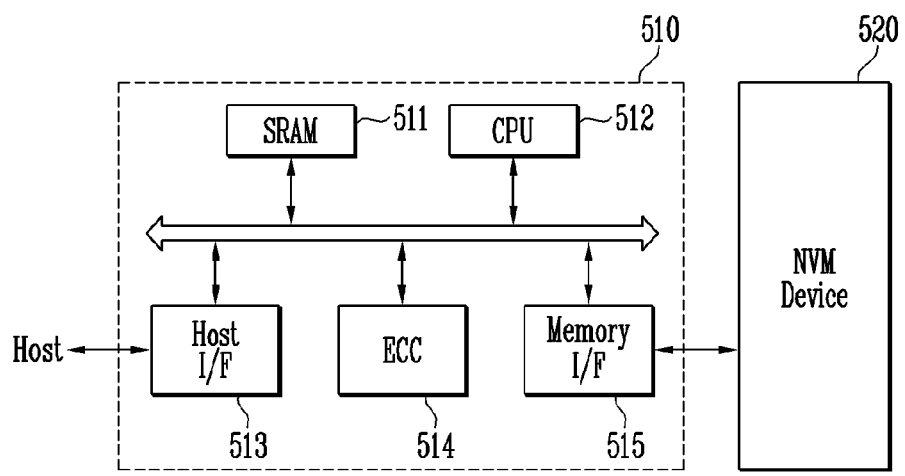
FIG. 5 is a schematic block diagram illustrating a representation of a memory system according to an embodiment.

FIG. 5 is a schematic block diagram illustrating a representation of a memory system 500 according to an embodiment.

Referring to FIG. 5, the memory system 500 may include a non-volatile memory (NVM) device 520 and a memory controller 510.

The non-volatile memory device 520 may correspond to the semiconductor devices described above with reference to FIGS. 1 to 4. The memory controller 510 may control the non-volatile memory device 520. The memory device 500 including the non-volatile memory device 520 and the memory controller 510 may be used as a memory card or a solid state disk SSD. An SRAM 511 may be used as an operation memory of a processing unit 512. A host interface 513 may include a data exchange protocol of the host coupled to the memory system 500. An error correction block 514 may check and correct an error in data read from the non-volatile memory device 520. A memory interface 514 may interface with the non-volatile memory device 520. The processing unit may perform control operation for data exchange.

The memory system 500 may further include a ROM (not illustrated) for storing code data for interfacing with the host and so on. The non-volatile memory device 520 may be provided in a multi-chip package including flash memory chips. The memory system 500 according to an embodiment may be used as a storage medium having low error probability, i.e. high reliability. The flash memory device may be used in a memory system such as the SSD. The memory controller 510 may communicate with an external device, e.g. a host through one of various interface protocols such as USB, MMC, PCI-E, SATA, PATA, SCSI, ESDI and IDE, etc.

Figure 6:
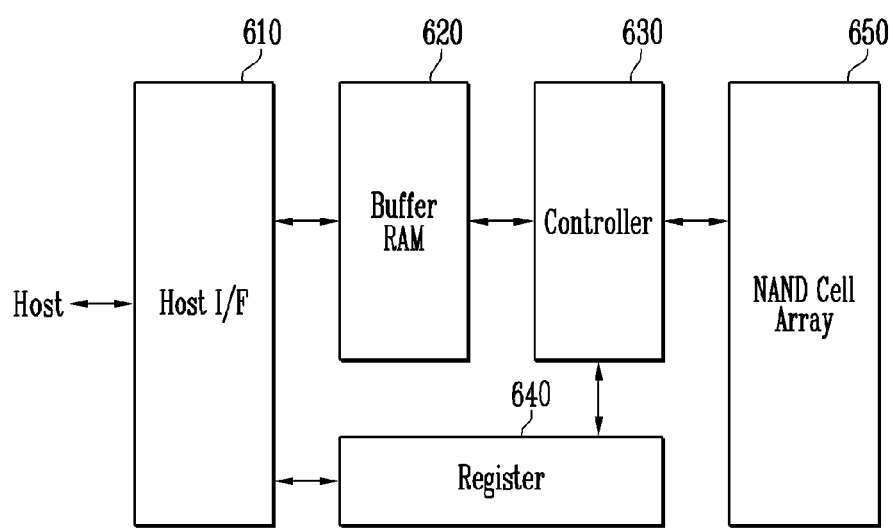
FIG. 6 is a schematic block diagram illustrating a representation of a fusion memory device or a representation of a fusion memory system according to the various other earlier described embodiments.

FIG. 6 is a schematic block diagram illustrating a representation of a fusion memory device or a representation of a fusion memory system for performing a program operation. For example, the various embodiments may be applied to a OneNAND flash memory device 600 as the fusion memory device. The NAND cell array 650 of the OneNAND flash memory device 600 may include the semiconductor devices described above with reference to FIGS. 1 to 5. The controller 630 may include the semiconductor devices described above with reference to FIGS. 1 to 5.

The OneNAND flash memory device 600 may include a host interface 610 for exchanging information with a device using different protocols. The OneNAND flash memory device 600 may include a buffer RAM 620 for embedding code for driving the memory device or storing data. The OneNAND flash memory device 600 may include a controller 630 for controlling reading, programming, and every state in response to a control signal and a command inputted from an external device. The OneNAND flash memory device 600 may include a register 640 for storing data such as configuration for defining command, address, and a system operation environment in the memory device. The OneNAND flash memory device 600 may include a NAND flash cell array 650 having an operation circuit including a non-volatile memory cell and a page buffer. The OneNAND flash memory device 600 may program data by a general method in response to a write request from the host.

Figure 7:
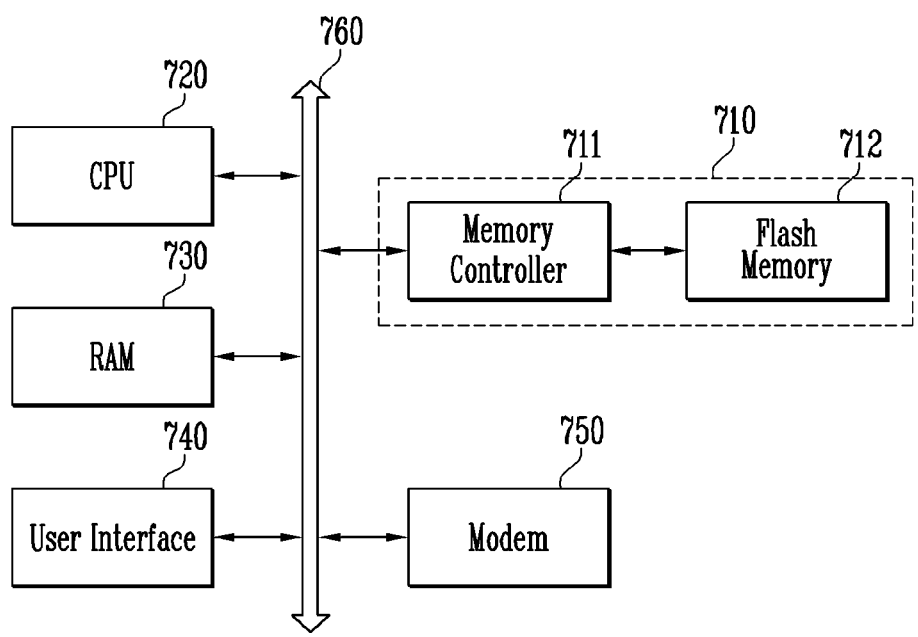
FIG. 7 is a schematic block diagram illustrating a representation of a computing system including a flash memory device according to an embodiment.

FIG. 7 is a schematic view illustrating a representation of a computing system including a flash memory device 712 according to an embodiment.

The computing system 700 according to an embodiment may include a microprocessor 720 connected electrically to a system bus 760, a RAM 730, a user interface 740, a modem 750 such as a baseband chipset, and a memory system 710. The memory system may include a flash memory coupled to a memory controller 711. The flash memory 712 may include the semiconductor devices described above with reference to FIGS. 1 to 6. The memory controller 711 may be a memory controller described above with reference to FIG. 5. In examples where the computing system 700 is a mobile device, a battery (not illustrated) for supplying an operation voltage of the computing system 700 may be further provided. The computing system 700 according to an embodiment may further include an application chipset, a camera image processor CIS, a mobile DRAM, etc. The memory system 710 may include an SSD using for example a non-volatile memory for storing data. The memory system 710 may be applied to a fusion flash memory, e.g. a OneNAND flash memory.

According to an embodiment, operating characteristics and electrical characteristics may be improved.

What is claimed is:

1. A semiconductor device, comprising:
   a memory string including a source selection transistor, first dummy memory cells, memory cells, second dummy memory cells and a drain selection transistor all coupled between a bit line and a common source line, and the drain selection transistor, the memory cells and the source selection transistor configured to operate, respectively, in response to voltages applied to a source selection line, first dummy word lines, word lines, second dummy word lines and a drain selection line, wherein the first dummy memory cells are coupled between the source selection transistor and the memory cells, and the second dummy memory cells are coupled between the drain selection transistor and the memory cells; and
   an operation circuit configured for performing a program operation on the memory string,
   wherein the operation circuit, after performing an operation programming the first and second dummy memory cells, is configured for sequentially performing a first operation programming memory cells adjacent to the drain selection transistor, a second operation programming memory cells adjacent to the source selection transistor, and a third operation programming remaining memory cells.

2. The semiconductor device of claim 1,
   wherein the operation circuit is configured for performing the first operation before the second operation, and for performing the second operation before the third operation,
   wherein the memory cells adjacent to the drain selection transistor are sequentially programmed by the first operation, and
   wherein the operation circuit is configured to perform a read operation and a verify operation on the memory string.

3. The semiconductor device of claim 1, wherein the operation circuit is configured for sequentially programming the memory cells in ascending order of distance from the drain selection transistor during the first operation.

4. The semiconductor device of claim 1, wherein the operation circuit is configured for sequentially programming the memory cells in ascending order of distance from the source selection transistor during the second operation.

5. The semiconductor device of claim 1, wherein the operation circuit is configured for sequentially programming the remaining memory cells in ascending order of distance from the source selection transistor during the third operation.

6. The semiconductor device of claim 1, wherein the operation circuit is configured for sequentially programming the remaining memory cells in descending order of distance from the drain selection transistor during the third operation.

7. The semiconductor device of claim 1, further comprising a pipe transistor coupled between intermediate memory cells, among the memory cells.

8. The semiconductor device of claim 1, wherein the operation circuit is configured for programming the first and second dummy memory cells at substantially the same time.

9. The semiconductor device of claim 2, wherein the operation circuit is configured for performing the read operation and the verify operation in the same order as the program operation.

10. A semiconductor device, comprising:
- a source selection transistor coupled to a common source line located over a substrate;
- a drain selection transistor coupled to a bit line located over the substrate;
- a pipe transistor formed on the substrate;
- a first cell string including memory cells coupled to the drain selection transistor;
- a second cell string including memory cells coupled to the source selection transistor;
- a third cell string including memory cells coupled between the second cell string and the pipe transistor;
- a fourth cell string including memory cells coupled between the first cell string and the pipe transistor;
- first dummy memory cells coupled between the source selection transistor and the second cell string;
- second dummy memory cells coupled between the drain selection transistor and the first cell string; and
- an operation circuit configured for performing a program operation on the memory cells included in the first to fourth cell strings,
- wherein the operation circuit is configured for sequentially performing the program operations on the first to fourth cell strings after performing a program operation on the first and second dummy memory cells.

11. The semiconductor device of claim 10, wherein the operation circuit is configured for sequentially programming the memory cells in ascending order of distance from the drain selection transistor when performing the program operation on the first cell string.

12. The semiconductor device of claim 10, wherein the operation circuit is configured for programming the memory cells in ascending order of distance from the source selection transistor when performing the program operation on the second cell string.

13. The semiconductor device of claim 10, wherein the operation circuit is configured for programming the memory cells in ascending order of distance from the source selection transistor when performing the program operation on the third cell string.

14. The semiconductor device of claim 10, wherein the operation circuit is configured for programming the memory cells in descending order of distance from the drain selection transistor when performing the program operation on the fourth cell string.

15. The semiconductor device of claim 10, wherein the operation circuit is configured for substantially simultaneously programming the first and second dummy memory cells.

16. The semiconductor device of claim 10,
- wherein the operation circuit is configured to perform a read operation and a verify operation on the memory cells included in the first to fourth cell strings, and
- wherein the operation circuit is configured for performing the read operation on the first to fourth cell strings in a sequential manner and the verify operation on the first to fourth cell strings in a sequential manner.

\* \* \* \* \*